(12) United States Patent
Konishi et al.

(10) Patent No.: US 11,442,096 B2
(45) Date of Patent: Sep. 13, 2022

(54) TESTING APPARATUS

(71) Applicant: Tokyo Electron Limited, Tokyo (JP)

(72) Inventors: Kentaro Konishi, Yamanashi (JP); Jun Fujihara, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/168,422

(22) Filed: Feb. 5, 2021

(65) Prior Publication Data

US 2021/0255233 A1    Aug. 19, 2021

(30) Foreign Application Priority Data

Feb. 19, 2020 (JP) .............................. JP2020-026167

(51) Int. Cl.
*G01R 31/28* (2006.01)
*G01R 31/26* (2020.01)
*G05D 23/19* (2006.01)

(52) U.S. Cl.
CPC ..... *G01R 31/2601* (2013.01); *G01R 31/2831* (2013.01); *G05D 23/19* (2013.01)

(58) Field of Classification Search
CPC ............ G01R 31/2601; G01R 31/2831; G01R 31/2868; G01R 31/2877; G01R 31/2874; G01R 1/07314; G01R 31/2867; G05D 23/19; G05D 23/1932; H01L 21/67017; H01L 21/67173; H01L 21/67178; H01L 21/67248; H01L 21/02; H01L 21/6719; H01L 21/67242; H01L 21/67288; H01L 22/10; H01L 22/30; F24F 11/0001; F24F 3/167
USPC .................................................. 324/750.03
See application file for complete search history.

(56) References Cited

U.S. PATENT DOCUMENTS

2009/0262454 A1* 10/2009 Merrow ............. G05D 23/1934
                                                              360/97.12
2011/0298630 A1* 12/2011 Kiyokawa .......... G01R 31/2862
                                                              340/686.1
2020/0168481 A1* 5/2020 Akiyama ........... G01R 31/2601

FOREIGN PATENT DOCUMENTS

| CN | 105739570 A | * | 7/2016 | ............. G05D 23/32 |
| JP | 2013-098454 | | 5/2013 | |
| JP | 2018-186128 | | 11/2018 | |
| JP | 2018186128 A | * | 11/2018 | ......... G01R 31/2601 |

(Continued)

OTHER PUBLICATIONS

Google English translation CN105739570A Multi-mode temperature control experiment teaching apparatus (Year: 2016).*

*Primary Examiner* — Jermele M Hollington
*Assistant Examiner* — Courtney G McDonnough
(74) *Attorney, Agent, or Firm* — IPUSA, PLLC

(57) ABSTRACT

A testing apparatus includes multiple testing units arrayed in a first axial direction in plan view, the multiple testing units being configured to respectively press probes against electronic devices on chucks to test the electronic devices, multiple gas circulating units respectively disposed in areas each corresponding to one or more testing units among the multiple testing units, the multiple gas circulating units respectively including first fans configured to circulate a gas in the areas along a second axial direction in plan view, multiple temperature detecting units configured to respectively detect temperatures of the chucks, and a controller configured to control drive of the first fans of the multiple gas circulating units based on the detected temperatures of the chucks.

10 Claims, 12 Drawing Sheets

(56) References Cited

FOREIGN PATENT DOCUMENTS

| KR | 10-2020-0007664 | 1/2020 |
| WO | 2011/016096 | 2/2011 |

\* cited by examiner

FIG.10

| DUTY CYCLE OF PWM SIGNAL OF FAN 120B (%) | DUTY CYCLE OF PWM SIGNAL OF FAN 120A (%) | TEMPERATURE OF CHUCK 15B |
|---|---|---|
| 0 | 0 | 1 |
| 40 | 100 | 2.17 |
| 60 | 100 | 2.25 |
| 80 | 100 | 2.42 |
| 100 | 100 | 2.5 |

TESTING APPARATUS

CROSS-REFERENCE TO RELATED APPLICATIONS

This patent application is based on and claims priority to Japanese Patent Application Mo. 2020-026167 filed on Feb. 19, 2020, the entire contents of which are incorporated herein by reference.

TECHNICAL FIELD

The present disclosure relates to a testing apparatus.

BACKGROUND

Patent Document 1 discloses a wafer testing apparatus including multiple testers arranged in a height direction and a width direction wherein, at both ends of a circulation region including multiple testers arranged in the width direction, a pair of air circulating units that circulates air in the circulation region is disposed. At the multiple testers, multiple chucks are held by suction, respectively.

The present disclosure provides a technique for uniformly cooling multiple chucks that are respectively provided for multiple testers.

RELATED ART DOCUMENT

Patent Document

[Patent Document 1] Japanese Laid-open Patent Application Publication No. 2018-186128

SUMMARY

According to one aspect of the present disclosure, a testing apparatus includes multiple testing units arrayed in a first axial direction in plan view, the multiple testing units being configured to respectively press probes against electronic devices on chucks to test the electronic devices, multiple gas circulating units respectively disposed in areas each corresponding to one or more testing units among the multiple testing units, the multiple gas circulating units respectively including first fans configured to circulate a gas in the areas along a second axial direction in plan view, multiple temperature detecting units configured to respectively detect temperatures of the chucks, and a controller configured to control drive of the first fans of the multiple gas circulating units based on the detected temperatures of the chucks.

According to one aspect of the present disclosure, multiple chucks respectively provided for multiple testing units can be uniformly cooled.

BRIEF DESCRIPTION OF THE DRAWINGS

FIG. 10 is a drawing illustrating an example of a relation between a duty cycle of a PWM signal driving a fan and a temperature differential of a chuck;

DETAILED DESCRIPTION OF EMBODIMENTS

Figure 1:
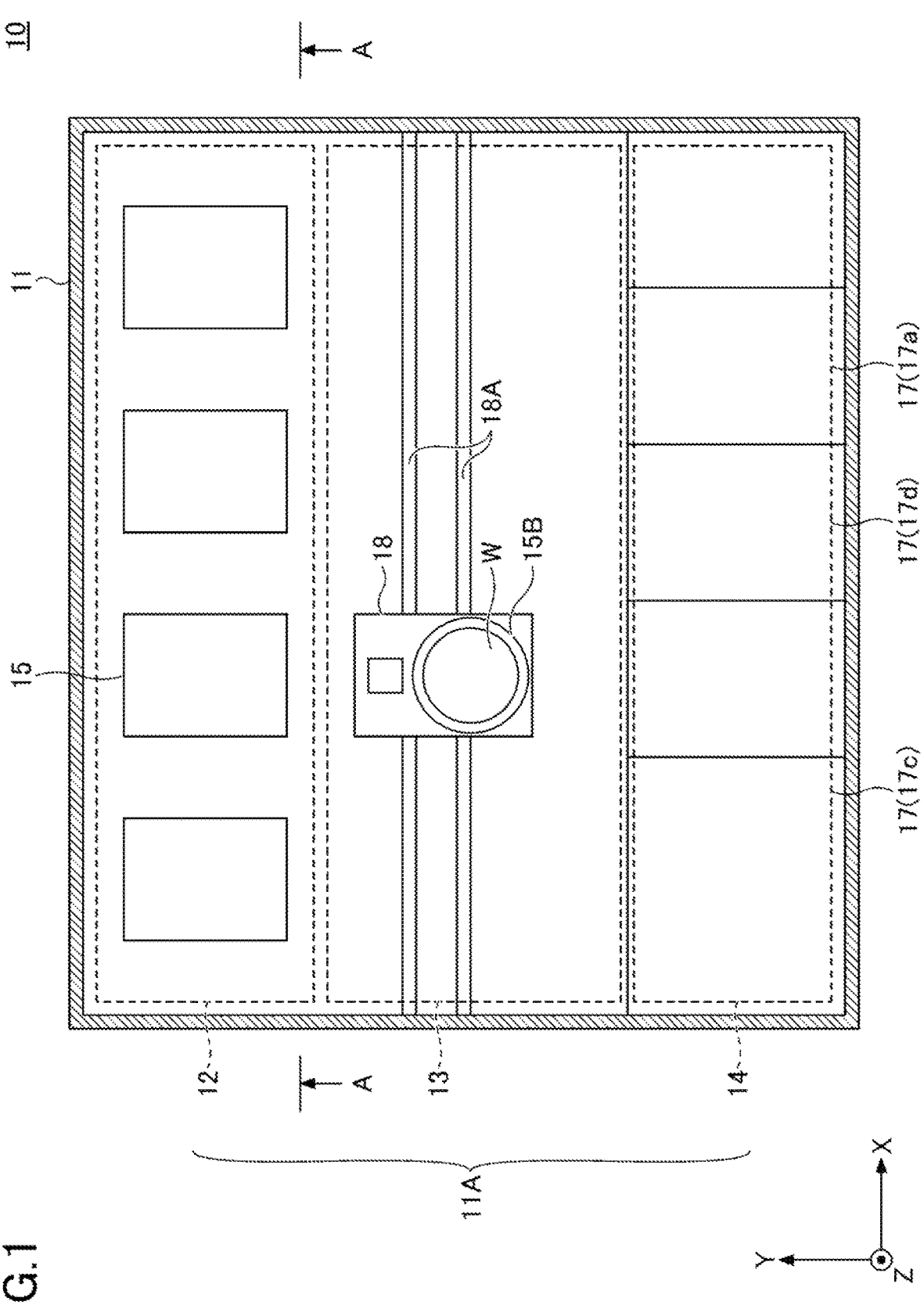
FIG. 1 is a cross-sectional view illustrating an example of a testing apparatus according to an embodiment.

In the following, an embodiment of the present disclosure will be described with reference to the drawings. In the specification and the drawings, the same reference numerals may be used to refer to the same or substantially the same components and overlapping descriptions may be omitted. Although a vertical direction or a vertical relationship illustrated in the drawings will be used for description in the following, it does not represent a universal vertical direction or a universal vertical relationship.

First Embodiment

Figure 2:
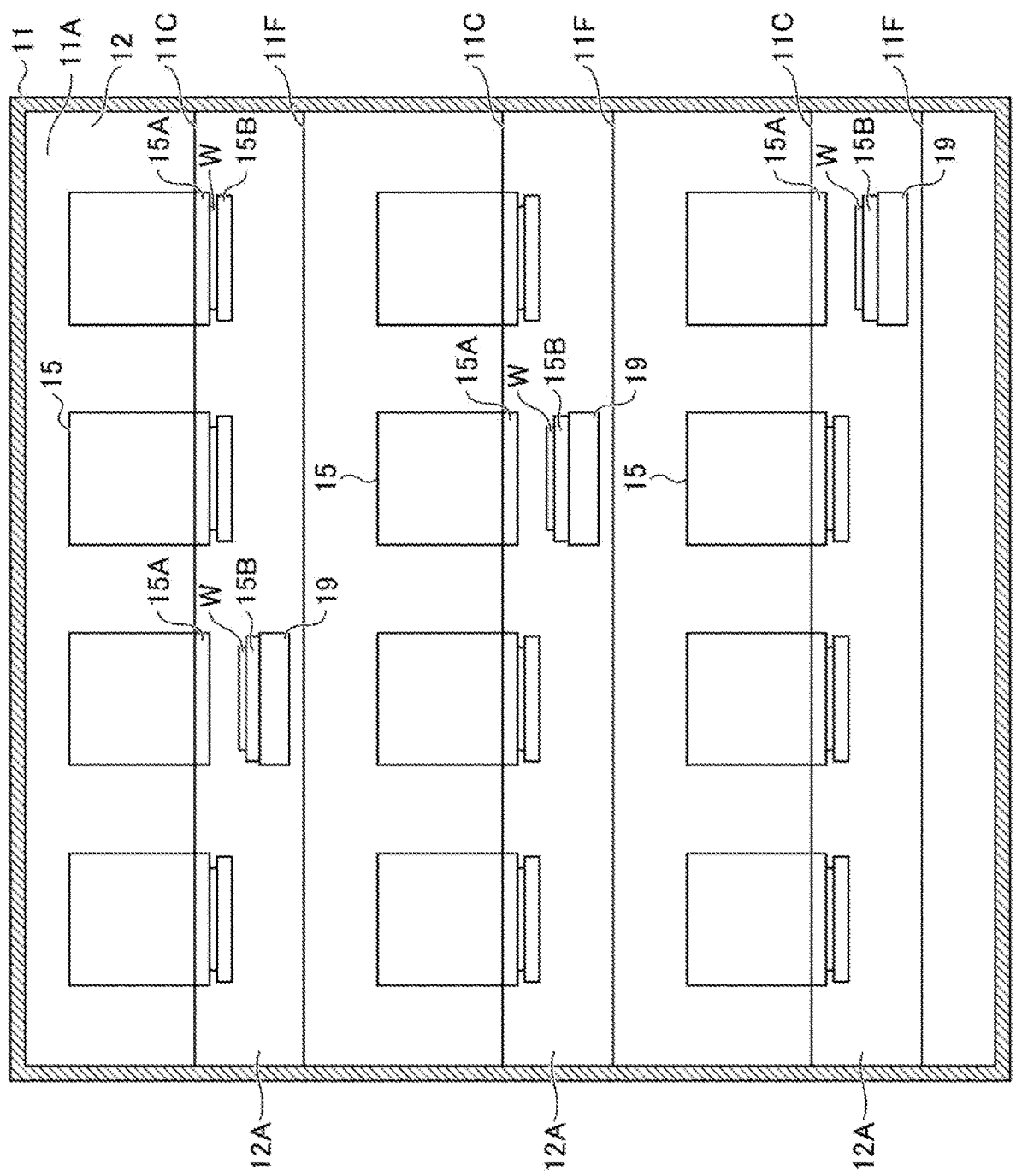
FIG. 2 is a drawing illustrating an example of a cross-sectional view of an entire of the testing apparatus in a cross-section corresponding to the A-A arrow cross-section in FIG. 1.

FIG. 1 is a cross-sectional view illustrating an example of a testing apparatus 10 according to an embodiment. FIG. 2 is a drawing illustrating an example of a cross-section of an entire of the testing apparatus 10 in a cross-section corresponding to the A-A arrow cross-section in FIG. 1. In the following, the XYZ coordinate system, which is an orthogonal coordinate system, is defined for description. The XY plane is a horizontal plane and the Z direction is a vertical direction. The X direction is an example of a first axial direction and the Y direction is an example of a second axial direction.

As illustrated in FIG. 1 and FIG. 2, the testing apparatus 10 includes a housing 11. An inner space of the housing 11 is a test chamber 11A. The test chamber 11A includes a test area 12, a transfer area 13, and a storage area 14.

In FIG. 1 and FIG. 2, walls (i.e., walls substantially parallel to the XZ plane) that are partitions between the test area 12, the transfer area 13, and the storage area 14, and openings and shutters provided on the walls are omitted.

The test area 12 is an area in which electrical characteristics of an electronic device formed on a wafer W are tested, and multiple testers 15 for testing wafers are disposed. The tester 15 is an example of a testing unit. As an example, in the test area 12, four testers 15 are disposed in the X direction in one level and three levels are provided in the vertical direction.

The test area 12 includes a test space 12A under the testers 15 of each level. The housing 11 has three floors 11F and three ceilings 11C in the test area 12, and three test spaces 12A are provided under the testers 15 provided at each of the three levels in the test area 12. The test space 12A is enclosed by the floor 11F, the ceiling 11C, and an inner wall of the housing 11, and is a closed space.

As described above, the test area 12 has test spaces 12A formed by dividing the test area 12 into three levels with the three floors 11F and the three ceilings 11C, but the transfer area 13 and the storage area 14 are not separated in the vertical direction and communicate in the vertical direction. A planar configuration of the teat space 12A on each floor is similar, and FIG. 1 illustrates the planar configuration of the testing apparatus 10 including the test space 12A on one floor. In each of the test spaces 12A, an aligner 19 is provided.

The transfer area 13 is an area provided between the test area 12 and the storage area 14. In the transfer area 13, a rail 18A that guides a transfer stage 18 in the X direction is provided. The transfer stage 18 will be described later.

The storage area 14 is partitioned into multiple accommodation spaces 17. FIG. 1 illustrates five accommodation spaces 17. In three accommodation spaces 17 among the five accommodation spaces 17, a port 17a that receives a FOUP, which is a container that accommodates multiple wafers W, a loader 17c to and from which a probe card is transferred, and a control unit 17d that controls an operation of each unit of the testing apparatus 10 are disposed.

A pogo frame 15A is provided under each of the testers 15. The pogo frame 15A is attached to the housing 11. The pogo frame 15A is located just under the ceiling 11C and holds a probe card, which is not illustrated. The pogo frame 15A holds the probe card and includes a pogo pin that contacts a terminal of the electronic device of the wafer W. The terminal of the electronic devices of the wafer W is electrically coupled to the tester 15 through the pogo frame 15A.

The chuck 15B is held by suction at the pogo frame 15A by a vacuum suction mechanism, which is not illustrated, in a state in which the chuck 15B is aligned by the aligner 19. When the chuck 15B is held by suction at the pogo frame 15A, a probe of the probe card is pressed against the terminal of the electronic device of the wafer W.

A camera (which is not illustrated) is provided in each of the testers 15, so that a position of the wafer W held on the upper surface of the chuck 15B is imaged, and image data captured by the camera is used when the position of the wafer W is aligned by the aligner 19.

The chuck 15B has a heating mechanism (heater) to heat the wafer W, and the wafer W is heated to a desired temperature when the tester 15 tests the electrical characteristics of the electronic device. The chuck 15B does not have a cooling mechanism that cools the chuck 15B by using a cooling liquid. That is, the testing apparatus 10 does not include a cooling mechanism (i.e., a chiller unit) that cools the chuck 15B by using a cooling liquid. The testing apparatus 10 has a configuration in which a chiller unit is not included.

The testing apparatus 10 includes a gas circulating device that circulates air in the test chamber 11A to cool the chuck 15B instead of a chiller unit. As an example, the gas circulating device is provided at each of the testers 15 on each floor. The gas circulating device will be described later with reference to FIG. 3.

The transfer stage 18 can move in the X direction along the rail 18A in the transfer area 13. The transfer stage 18 includes arms or the like that can be operated in the Y direction and the Z direction and can transfer the wafer W in the X direction, the Y direction, and the Z direction. The transfer stage 18 receives the wafer W from the port 17a of the storage area 14, transfers the wafer in the X direction in the transfer area 13, and passes the wafer through a shutter to the aligner 19 in the test space 12A. The transfer stage 18 receives the wafer W, of which the electrical characteristics of the electronic device has been tested from the aligner 19 in the test space 12A through the shutter, transfers the wafer in the transfer area 13 in the X direction, and passes the wafer to the port 17a.

Figure 3:
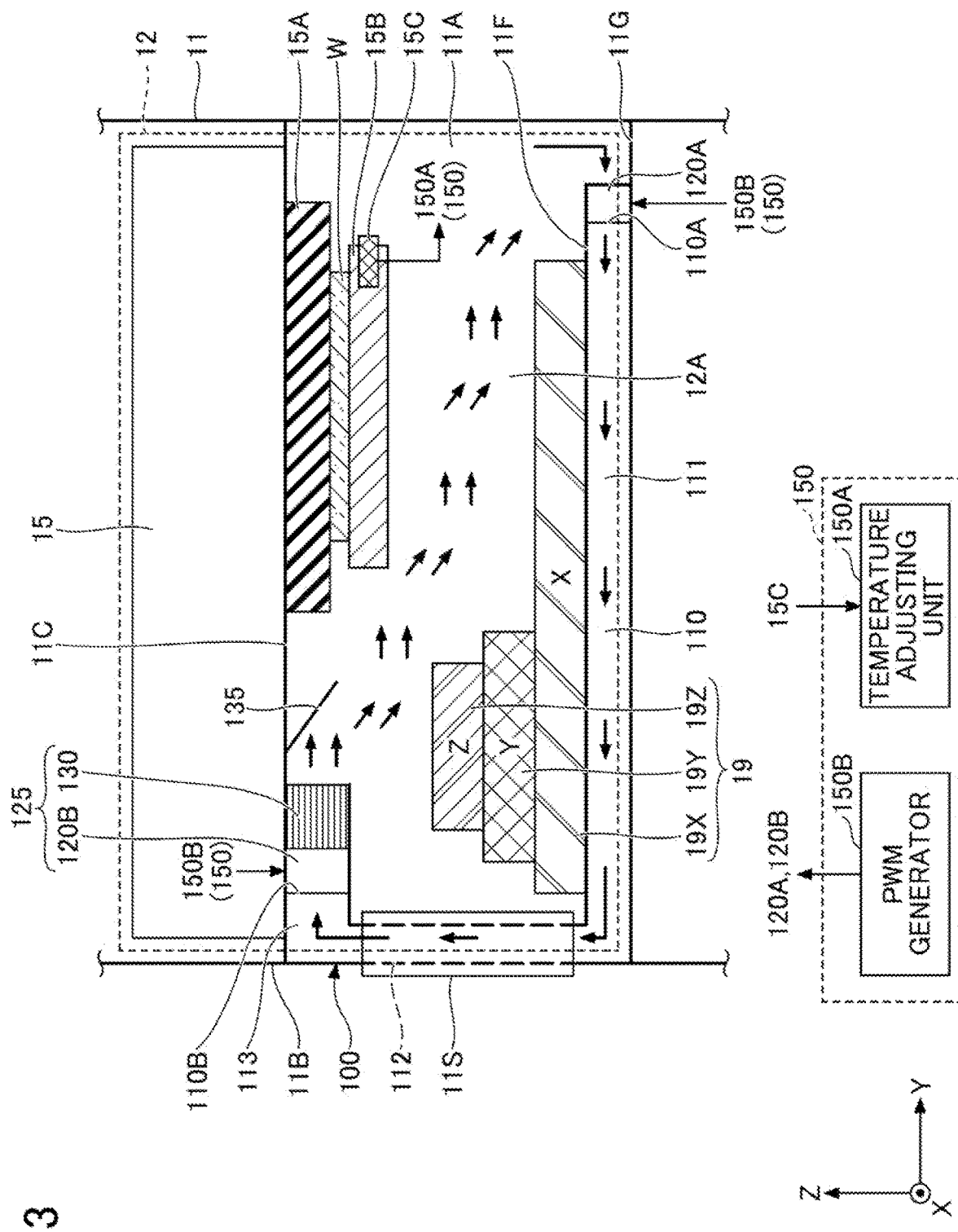
FIG. 3 is a cross-sectional view illustrating an example of a state in which a gas circulating device is provided in a test region.

FIG. 3 is a cross-sectional view illustrating an example of a state in which a gas circulating device 100 is provided in the test area 12. The gas circulating device 100 is an example of a gas circulating unit. FIG. 3 also illustrates the aligner 19. The aligner 19 is provided on the floor 11F of the housing 11.

The aligner 19 is provided in the test space 12A on each floor. The aligner 19 has a structure in which an X stage 19X, a Y stage 19Y, and a Z stage 19Z are stacked in this order from bottom to top. The X stage 19X can move in the X direction, the Y stage 19Y can move in the Y direction with respect to the X stage 19X, and the Z stage 19Z can move in the Z direction with respect to the Y stage 19Y.

The aligner 19 receives the wafer W from the transfer stage 18 through a shutter 11S provided in a wall 11B of the test space 12A on a −Y direction side. The aligner 19 transfers the chuck 15B holding the wafer W to each of the testers 15 and aligns the wafer W relative to the probe card held by the pogo frame 15A. In a state in which such an alignment is performed, the chuck 15B is held by suction at the pogo frame 15A by a vacuum suction mechanism, which is not illustrated.

The aligner 19 receives, from the pogo frame 15A, the chuck 15B holding the wafer W of which the electrical characteristics of the electronic device has been tested, and passes the wafer W to the transfer stage 18 through the shutter 11S.

The gas circulating device 100 is provided corresponding to each of the testers 15 in the test area 12. That is, if the testing apparatus 10 includes 12 testers 15 as illustrated in FIG. 2, the testing apparatus 10 includes 12 gas circulating devices 100, and four gas circulating devices 100 are provided on each floor. As the configurations of the gas circulating devices 100 provided on each floor are similar to one another, FIG. 3 illustrates the configuration of the single gas circulating device 100 provided corresponding to the single tester 15 on a floor.

A space in which a gas is circulated by each gas circulating device 100 within the test space 12A is referred to as a cell. The cell is an example of a region corresponding to each tester 15. There are 12 cells in the testing apparatus 10 illustrated in FIG. 1 and FIG. 2. The configuration illustrated in FIG. 3 is a configuration for one cell and is similar in 12 cells. Details of the configuration of the cell are described below with reference to FIGS. 4 to 7.

FIG. 3 illustrates the single aligner 19 provided for the four cells of each floor, and there are three cells on each floor at which the aligner 19 is not present.

The gas circulating device 100 is an example of a gas circulating unit and includes a duct 110, fans 120A and 120B, a filter 130, a louver 135, and a controller 150. The fan 120B and the filter 130 constitute a fan filter unit (FFU) 125. The gas circulating device 100 is a device that circulates air in each cell in the test space 12A.

The chuck 15B is provided with a temperature detecting unit 15C. The temperature detecting unit 15C is an element that detects the temperature of the chuck 15B, and a thermocouple may be used, for example. The temperature detecting unit 15C is connected to the controller 150.

The duct 110 has a suction inlet 110A, an exhaust outlet 110B, and flow paths 111, 112, and 113. The flow paths 111, 112, and 113 are connected in series between the suction inlet 110A and the exhaust outlet 110B in this order.

The suction inlet 110A is provided in a step 11G. The step 11G is a portion that is in proximity to an end of the test chamber 11A on the +Y direction side, that is lower than the floor 11F by the height of a fan 120A, and that extends from end to end in the X direction on each floor in the test chamber 11A. The suction inlet 110A is provided with the fan 120A. An end in the +Y direction at which the suction inlet 110A is provided is an example of a first end in the second axial direction.

The exhaust outlet 110B is provided just under the ceiling 11C near an end on the −Y direction side in the test chamber 11A. The exhaust outlet 110B is provided toward the +Y direction in which the chuck 15B is provided. An end in the −Y direction at which the exhaust outlet 110B is provided is an example of a second end in the second axial direction.

A flow path 111 of the duct 110 extends in the −Y direction along the floor 11F from the suction inlet 110A provided in the step 11G under the floor 11F. An end of the flow path 111 on the −Y direction side is connected to a lower end of a flow path 112.

The flow path 112 of the duct 110 branches in the −X direction and the +X direction, and extends in the up and down direction on both sides of the shutter 11S in the X direction. An upper end of the flow path 112 is connected to an end of the flow path 113 on the −Y direction side.

The flow path 113 of the duct 110 extends along the ceiling 11C to the exhaust outlet 110B on the +Y direction side. The fan 120B and the filter 130 are provided in the exhaust outlet 110B, which is an end of the flow path 113 on the +Y direction side. The configuration of the duct 110 will be described in detail below with reference to FIGS. 4 to 7.

The fan 120A is an example of a second fan and is provided at the suction inlet 110A of the duct 110. That is, the fan 120A is provided at the suction inlet 110A in the step 11G that is lower than the floor 11F by one step near an end of the floor 11F on the +Y direction side in the test chamber 11A.

Although FIG. 3 illustrates a configuration in which the fan 120A is connected to the suction inlet 110A outside the duct 110, the fan 120A may be provided at the suction inlet 110A within the duct 110. In either case, the fan 120A is provided at the suction inlet 110A of the duct 110.

Although FIG. 3 illustrates a configuration in which the fan 120A is provided in the step 11G that is lower than the floor 11F by one step, the fan 120A may be provided on the surface of the floor 11F. In either case, the fan 120A is provided on the floor 11F.

The fan 120A is provided as an assist fan (i.e., an auxiliary fan) for the fan 120B. The fan 120A is driven by the controller 150 to suction air near the floor 11F of the test chamber 11A into the duct 110.

The fan 120A is provided on the floor 11F, so that foreign objects such as dust accumulated on the floor 11F can be efficiently auctioned into the duct 110 by the fan 120A.

The fan 120B is an example of a first fan and is provided at the exhaust outlet 110B of the duct 110. That is, the fan 120B is provided near an end of the test chamber 11A on the −Y direction side at the exhaust outlet 110B located just under the ceiling 11C. The fan 120B is provided at the exhaust outlet 110B and is provided directed in the +Y direction toward the chuck 15B. The fan 120B is driven by the controller 150.

Although FIG. 3 illustrates a configuration in which the fan 120B is connected to the exhaust outlet 110B outside the duct 110, the fan 120B may be provided at the exhaust outlet 110B within the duct 110. In either case, the fan 120B is provided at the exhaust outlet 110B of the duct 110.

The filter 130 is provided on the exhaust side of the fan 120B, so that air in the duct 110 that is exhausted by the fan 120B passes through the filter 130 and then escapes into the test chamber 11A.

The filter 130 is connected to the exhaust outlet 110B of the duct 110 through the fan 120B. The filter 130 filters contaminants, such as dust, which may be contained in the air exhausted from the duct 110 by the fan 120B to clean the exhausted air. That is, the filter 130 cleans the air exhausted from the duct 110. The filter 130 is provided on the exhaust side of the fan 120B, so that cleaner air can be supplied into the test chamber 11A.

The duct 110 causes air that is suctioned from an inner space of the test chamber 11A by the fan 120A at the suction inlet 110A to escape from the exhaust outlet 110B. The air exhausted from the exhaust outlet 110B is suctioned by the fan 120B, and contaminants, such as dust, are removed by the filter 130 before the air is exhausted into the test chamber 11A.

Although FIG. 3 illustrates a configuration in which the filter 130 and the fan 120B are connected to the exhaust outlet 110B outside the duct 110, the filter 130 and the fan 120B may be provided at the exhaust outlet 110B within the duct 110. Additionally, the fan 120B may be provided at the exhaust outlet 110B within the duct 110, and the filter 130 may be connected to the exhaust outlet 110B outside the duct 110. In either case, the filter 130 is provided at the exhaust outlet 110B of the duct 110.

The louver 135 hangs from the ceiling 11C on the +Y direction side from the filter 130. The louver 135 is provided to direct the clean air exhausted from the filter 130 obliquely downward toward the chuck 15B, as indicated by the arrow in FIG. 3.

The filter 130 is just under the ceiling 11C in the height direction, and the chuck 15B is located below the ceiling 11C. Thus, more air exhausted from the filter 130 can be blown toward the chuck 15B when the air exhausted from the filter 130 is directed obliquely downward in comparison with when the air is blown straight in the +Y direction.

In view of the difference between positions of the filter 130 and the chuck 15B in the height direction, the louver 135 is provided to efficiently cause the air exhausted from the filter 130 to be blown toward the chuck 15B and efficiently cool the chuck 15B.

The controller 150 includes a temperature adjusting unit 150A and a pulse width modulation (PWM) generator 150B. The controller 150 is implemented by a computer including, for example, a central processing unit (CPU), a random access memory (RAM), a read only memory (ROM), and the like. The controller 150 may be disposed, for example, in any of the multiple accommodation spaces 17. In this case, the temperature adjusting unit 150A and the PWM generator 150B may be integrated as the controller 150, or may be provided in separate locations. The controller 150 may be included in the control unit 17d.

The temperature adjusting unit 150A compares the temperature of the chuck 15B detected by the temperature detecting unit 15C with a temperature threshold of the chuck 15B and then outputs a control command in accordance with the temperature difference between the detected temperature of the chuck 15B and a set value. If the single gas circulating device is provided for multiple testers 15, the temperatures of the multiple chucks 15B are detected. In this case, the temperature adjusting unit 150A may select the highest value of the detected temperatures of the multiple chucks 15B and compare the selected value with the temperature threshold. Alternatively, the temperature adjusting unit 150A may calculate an average value of the detected temperatures of the multiple chucks 15B and compare the average value with the temperature threshold.

More specifically, for example, when the temperature of the chuck 15B detected by the temperature detecting unit 15C exceeds a temperature threshold of the chuck 15B, the temperature adjusting unit 150A outputs a control command to increase the cooling amount of the chuck 15B in accordance with the temperature difference between the temperature of the chuck 15B and the set value. When the temperature of the chuck 15B detected by the temperature detecting unit 15C is below a temperature threshold of the chuck 15B, the temperature adjusting unit 150A outputs a control command to reduce the cooling amount of the chuck 15B in accordance with the temperature difference between the temperature of the chuck 15B and the set value.

As described above, the temperature adjusting unit 150A generates and outputs the control command by performing feedback control using the temperature of the chuck 15B detected by the temperature detecting unit 15C.

The PWM generator 150B generates PWM signals that drive the fans 120A and 120B based on the control command input from the temperature adjusting unit 150A and outputs the PWM signals to the fans 120A and 120B, respectively. Since the fan 120B has the filter 130 on the exhaust side and air is pumped, the PWM generator 150B sets a duty cycle of the PWM signal driving the fan 120B to be larger than a duty cycle of the PWM signal driving the fan 120A. For example, the duty cycle of the PWM signal driving the fan 120B is approximately twice as great as the duty cycle of the PWM signal driving the fan 120A.

If the temperature adjusting unit 150A inputs the control command to increase the cooling amount of the chuck 15B, the PWM generator 150B increases the duty cycles of the PWM signals that drive the fans 120A and 120B. As a result, the rotational speeds of the fans 120A and 120B are increased, thereby increasing the flow rate of the air blown from the fan 120B to the chuck 15B through the filter 130.

Conversely, if the temperature adjusting unit 150A inputs the control command to reduce the cooling amount of the chuck 15B, the PWM generator 150B reduces the duty cycles of the PWM signals that drive the fans 120A and 120B. As a result, the rotational speeds of the fans 120A and 120B are reduced, thereby reducing the flow rate of the air blown from the fan 120B to the chuck 15B through the filter 130.

As described above, the controller 150 including the temperature adjusting unit 150A and the PWM generator 150B controls the drive of the fans 120A and 120B to increase the rotational speeds of the fans 120A and 120B if the temperature of the chuck 15B detected by the temperature detecting unit 15C exceeds the temperature threshold value on the high-temperature side. Additionally, the controller 150 including the temperature adjusting unit 150A and the PWM generator 150B controls the drive of the fans 120A and 120B to reduce the rotational speeds of the fans 120A and 120B if the temperature of the chuck 15B detected by the temperature detecting unit 15C is below the temperature threshold value on the low-temperature side.

With such a gas circulating device 100, in each cell, clean air blown from the filter 130, provided just under the ceiling 11C in the −Y direction, is caused to flow obliquely downward by the louver 135, as illustrated by the arrows in FIG. 3. The clean air further flows toward the fan 120A attached to the suction inlet 110A of the duct 110, as the clean air flows in the +Y direction along the side surface of the chuck 15B on the −Y direction side and the bottom surface of the chuck 15B and gradually falls. At this time, the chuck 15B is cooled by the air.

The air that cools the chuck 15B is then auctioned into the duct 110 by the fan 120A, passes through the duct 110, and is exhausted by the fan 120B after contaminants, such as dust, have been removed by the filter 130. Such airflow is substantially the same in each cell.

With such a gas circulating device 100, in each cell, air circulates clockwise when the YZ cross section is viewed from the +X direction side to the −X direction side. The test space 12A including four cells is enclosed by the floor 11F, the ceiling 11C, the shutter 11S, the inner wall of the housing 11, and the like, and is a closed space.

Thus, in each cell in the test space 12A of the test chamber 11A, air flows from the filter 130 located upstream toward the fan 120A located downstream. That is, each cell, air flows from the filter 130 toward the fan 120A in the +Y direction and the −Z direction. This can uniformly cool the chucks 15B in the cells.

Figure 4:
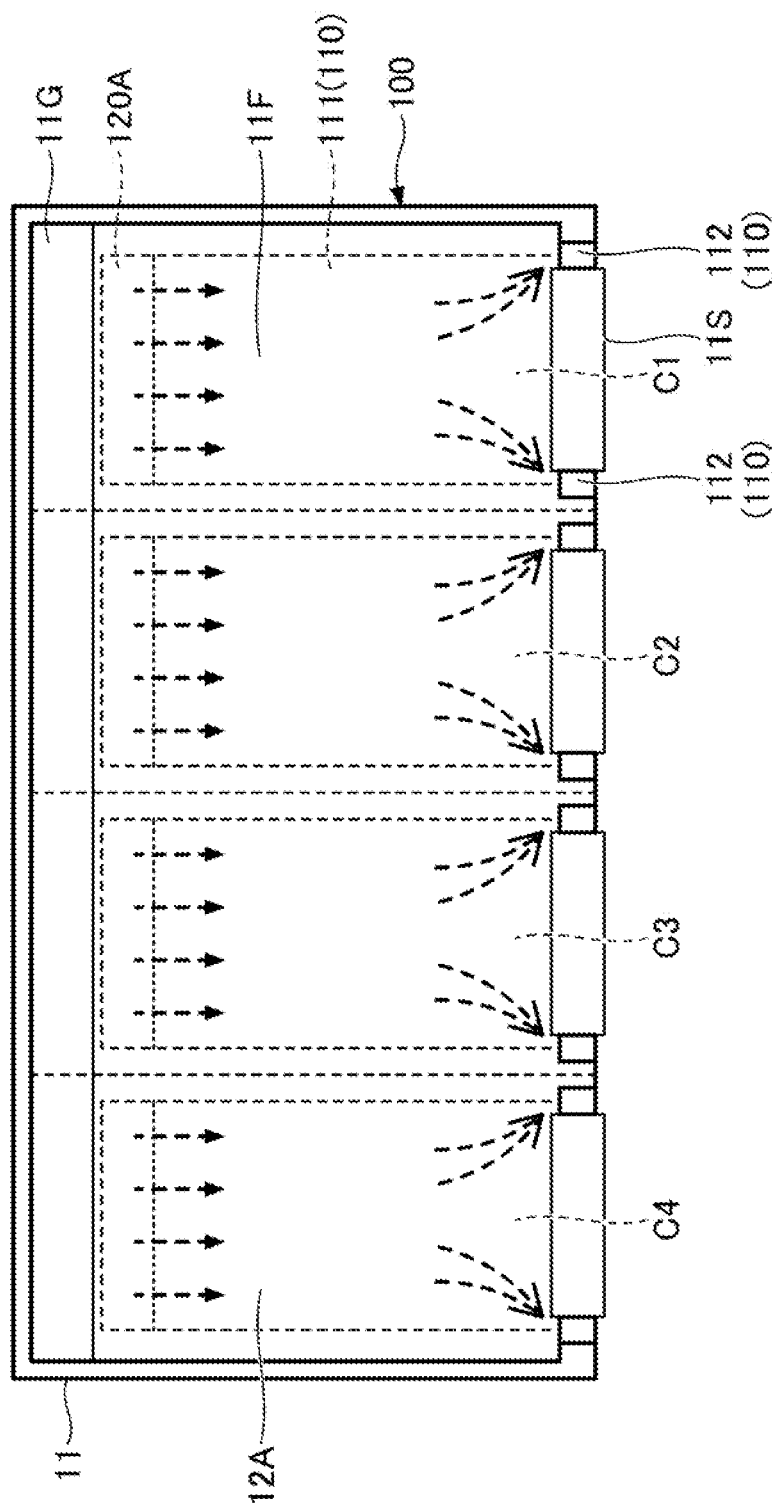
FIG. 4 is a drawing illustrating an example of a simulation model of the testing apparatus equipped with the gas circulating device.
Figure 5:
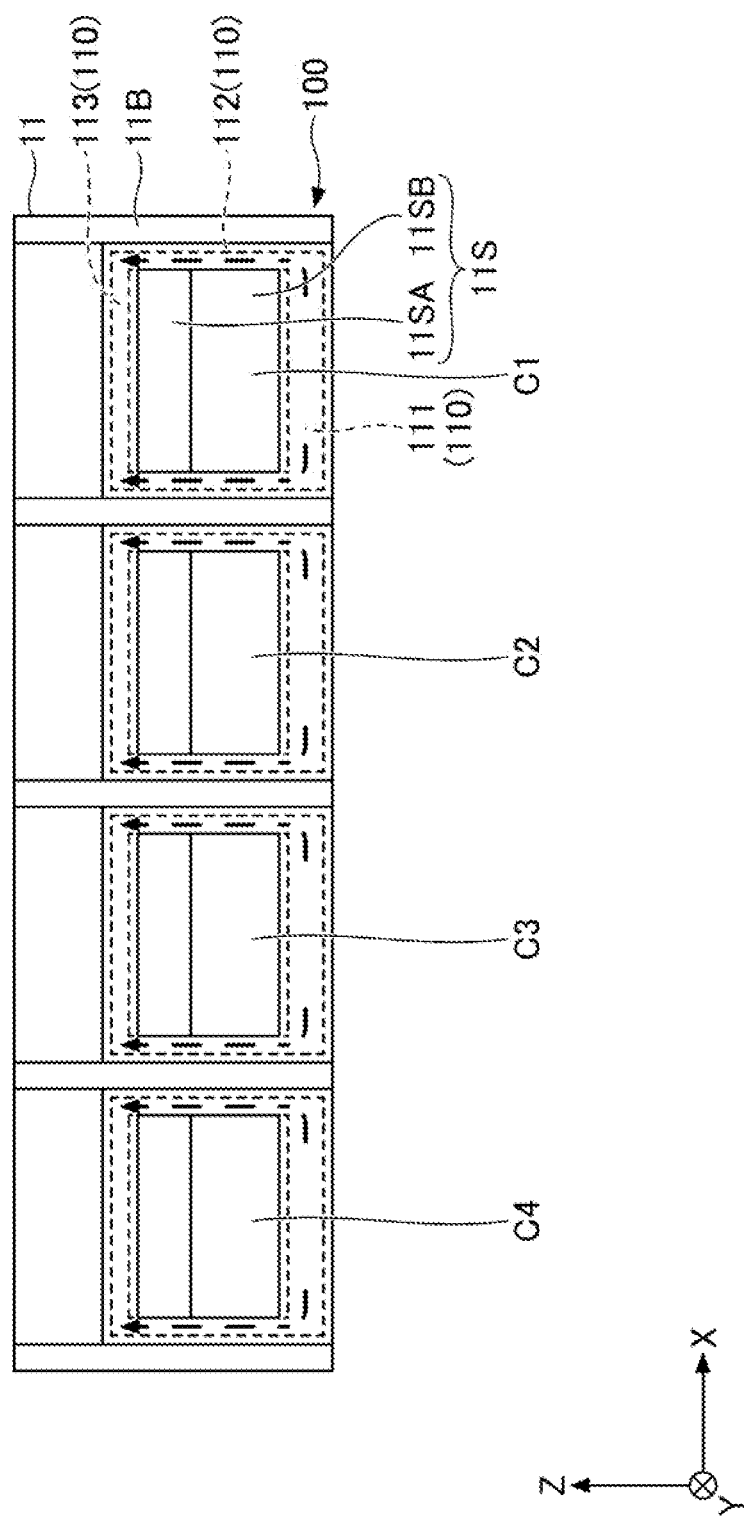
FIG. 5 is a drawing illustrating an example of the simulation model of the testing apparatus equipped with the gas circulating device.
Figure 6:
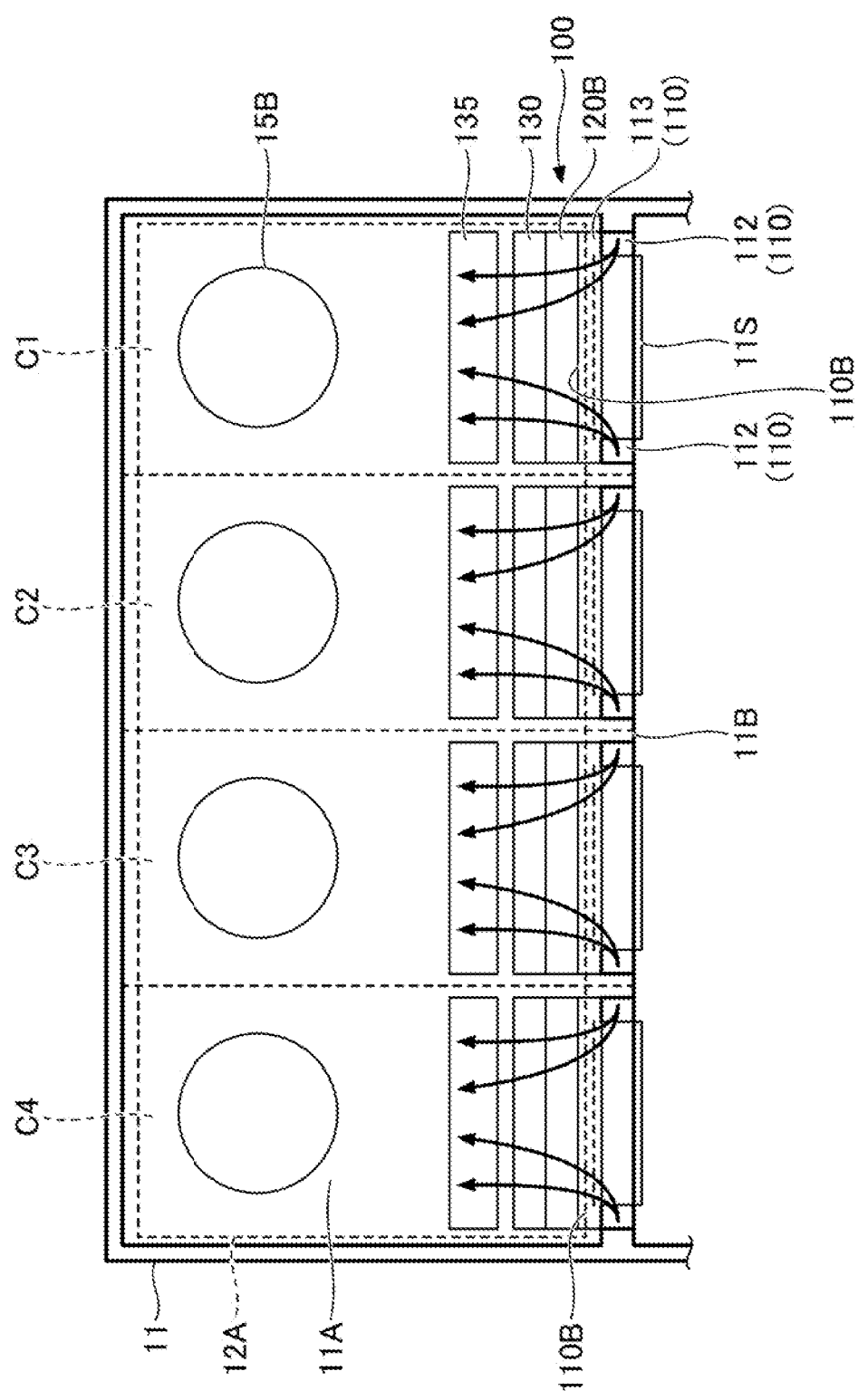
FIG. 6 is a drawing illustrating an example of the simulation model of the testing apparatus equipped with the gas circulating device.
Figure 6:
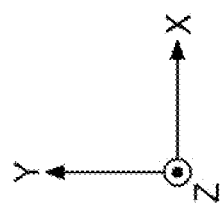

FIGS. 4 to 7 are drawings each illustrating an example of a simulation model of the testing apparatus 10 to which the gas circulating device 100 is attached. FIGS. 4 to 6 illustrates four cells C1 to C4 on the same floor.

Figure 7:
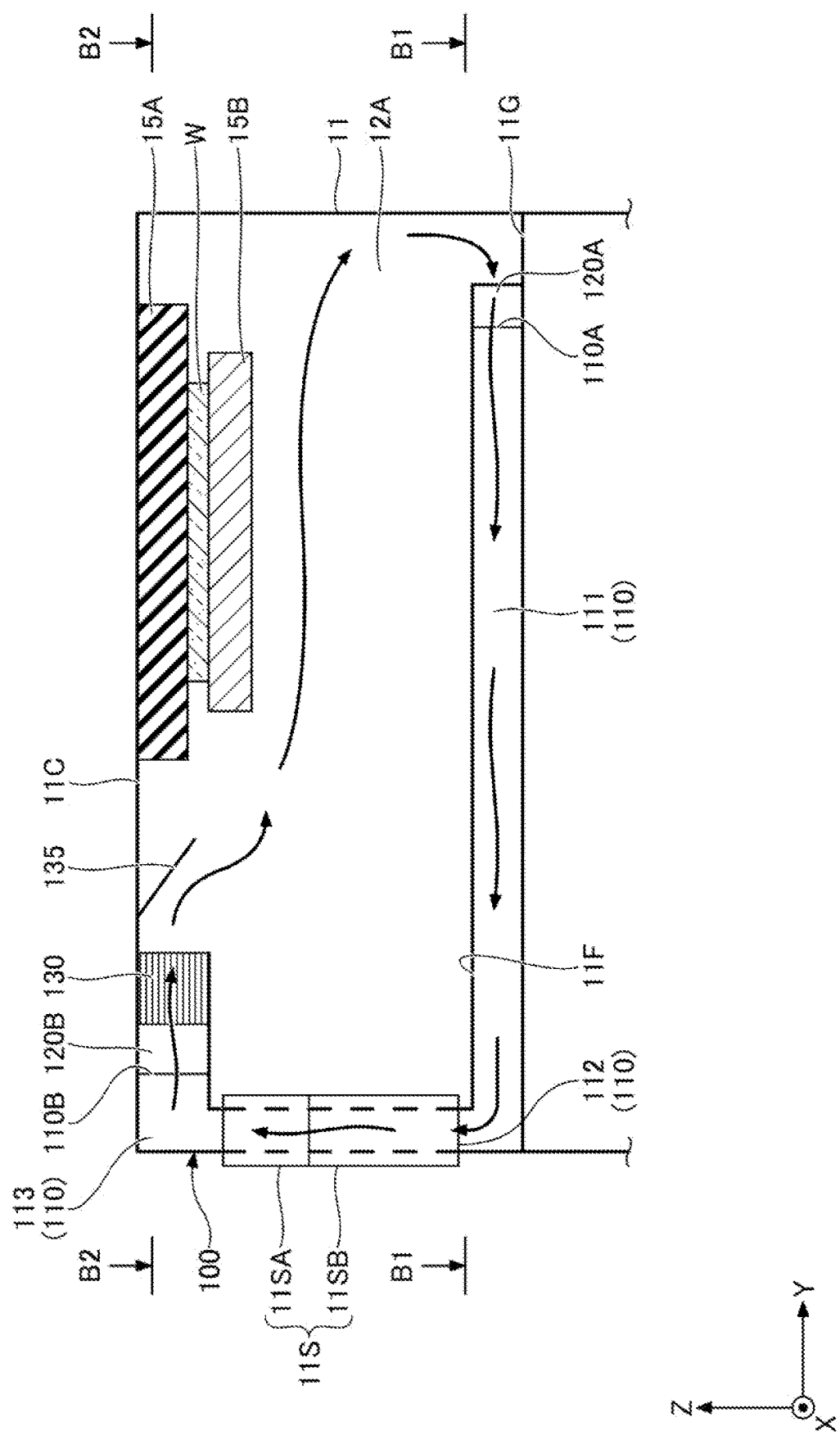
FIG. 7 is a drawing illustrating an example of the simulation model of the testing apparatus equipped with the gas circulating device.

FIG. 4 illustrates a configuration corresponding to the B1-B1 arrow cross-section of FIG. 7 viewed downwards from directly above the floor 11F of the test chamber 11A. FIG. 5 illustrates a plane in which the testing apparatus 10 is viewed from the −Y direction side.

FIG. 6 illustrates a configuration corresponding to the B2-B2 arrow cross-section in FIG. 7 viewed downward from the ceiling 11C of the test chamber 11A. In FIG. 6, the pogo frame 15A and the wafer W are omitted and the positions of the chucks 15B are illustrated by circles. FIG. 7 illustrates a configuration of each cell when a cross-section parallel to the YZ plane of each cell is viewed from the +X direction side. The configuration of FIG. 1 corresponds to the configuration of FIG. 3.

As illustrated in FIGS. 4 to 6, in each of the cells C1 to C4, two flow paths 112 are provided on both sides of the shutter 11S in the X direction.

As illustrated in FIG. 4, air suctioned by the fan 120A to the suction inlet 110A of the duct 110 flows in the −Y direction through the flow path 111 under the floor 11F and flows into the two flow paths 112 on both sides of the shutter 11S, as indicated by the dotted arrows. In each of the cells C1 to C4, the shape of the flow path 111 is rectangular in plan view.

As illustrated in FIG. 5, in each of the cells C1 to C4, the single shutter 11S is provided at the wall 11B of the housing 11 on the −Y direction side. The shutter 11S has an opening and closing portion 11SA and a base 11SB. In FIG. 5, the transfer area 13, in which the transfer stage 18 (see FIG. 1 and FIG. 2) is disposed, is on the front side (i.e., the −Y direction side) of the shutter 11S, and the test chamber 11A is on the rear side (i.e., the +Y direction side) of the shutter 11S. The opening and closing portion 11SA is positioned above the base 11SB, and the door of the opening and closing portion 11SA moves downward so that the transfer area 13 and the test chamber 11A communicate with each other.

In each of the cells C1 to C4, the two flow paths 112 are provided on both sides of the shutter 11S in the lateral direction (i.e., the X direction), and in the two flow paths 112, air flows from the bottom to the top as indicated by the dashed arrows.

As illustrated in FIG. 6, upper ends of the two flow paths 112 of the duct 110 are connected to the flow path 113. The filter 130 is connected to the exhaust outlet 110B, which is an end of the flow path 113 on the +Y direction side, through the fan 120B.

Air flowing upward through the two flow paths 112 is suctioned by the fan 120B through a rectangular flow path 113 in plan view and is exhausted from the filter 130, so that the air is blown toward the louver 135 as indicated by the arrows.

As a result, as indicated by the arrows in FIG. 7, air exhausted from the filter 130 is directed obliquely downward by the louver 135 and flows along the side surface of the chuck 15B on the −Y direction side and the bottom surface of the chuck 15B. Further, air moves downwardly and is suctioned by the fan 120A into the duct 110 through the suction inlet 110A, and then through the flow paths 111, 112, and 113, the air is suctioned by the fan 120B and exhausted from the filter 130.

Figure 8:
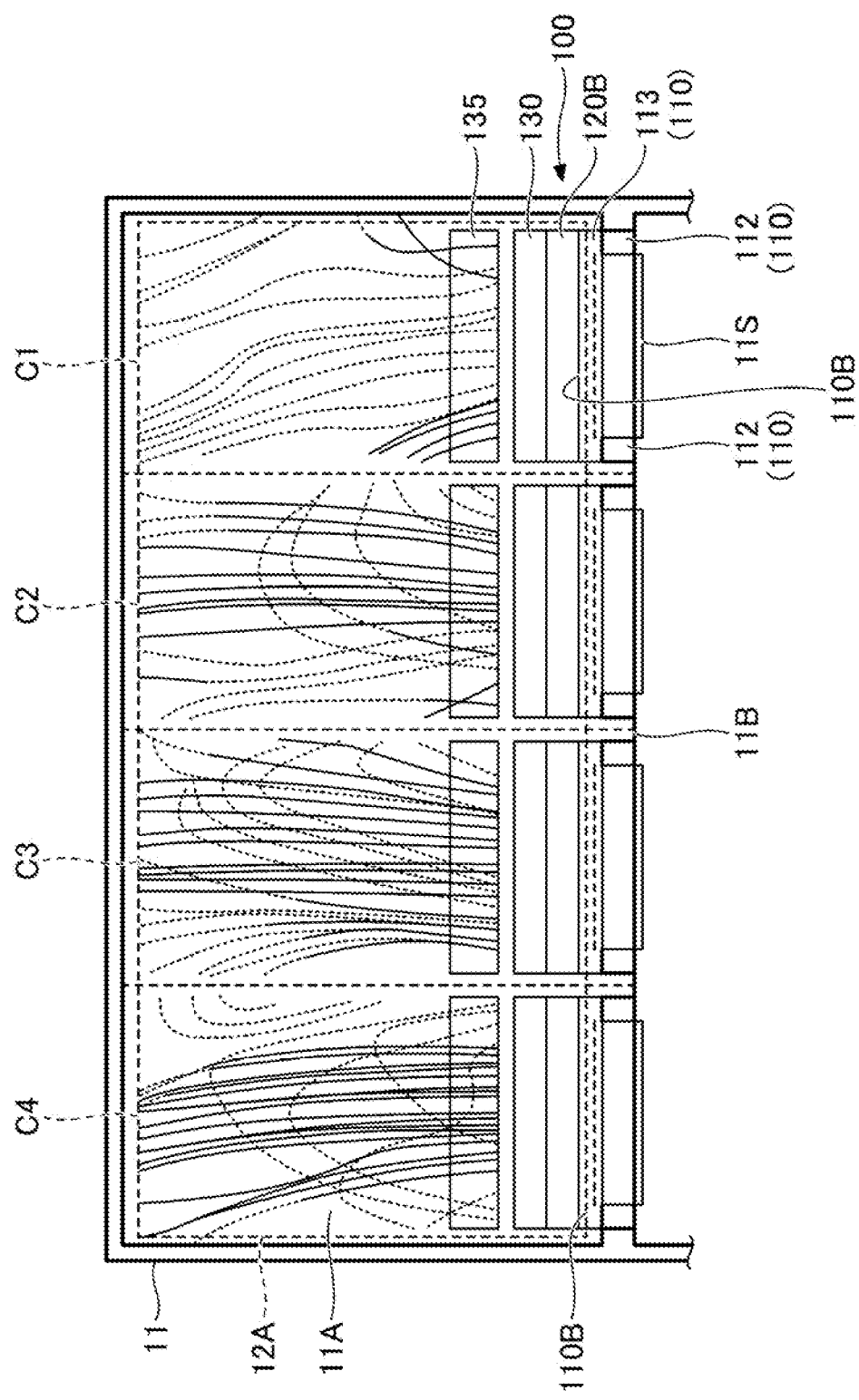
FIG. 8 is a drawing illustrating an example of airflow obtained by using simulation in the simulation model of the testing apparatus.
Figure 9:
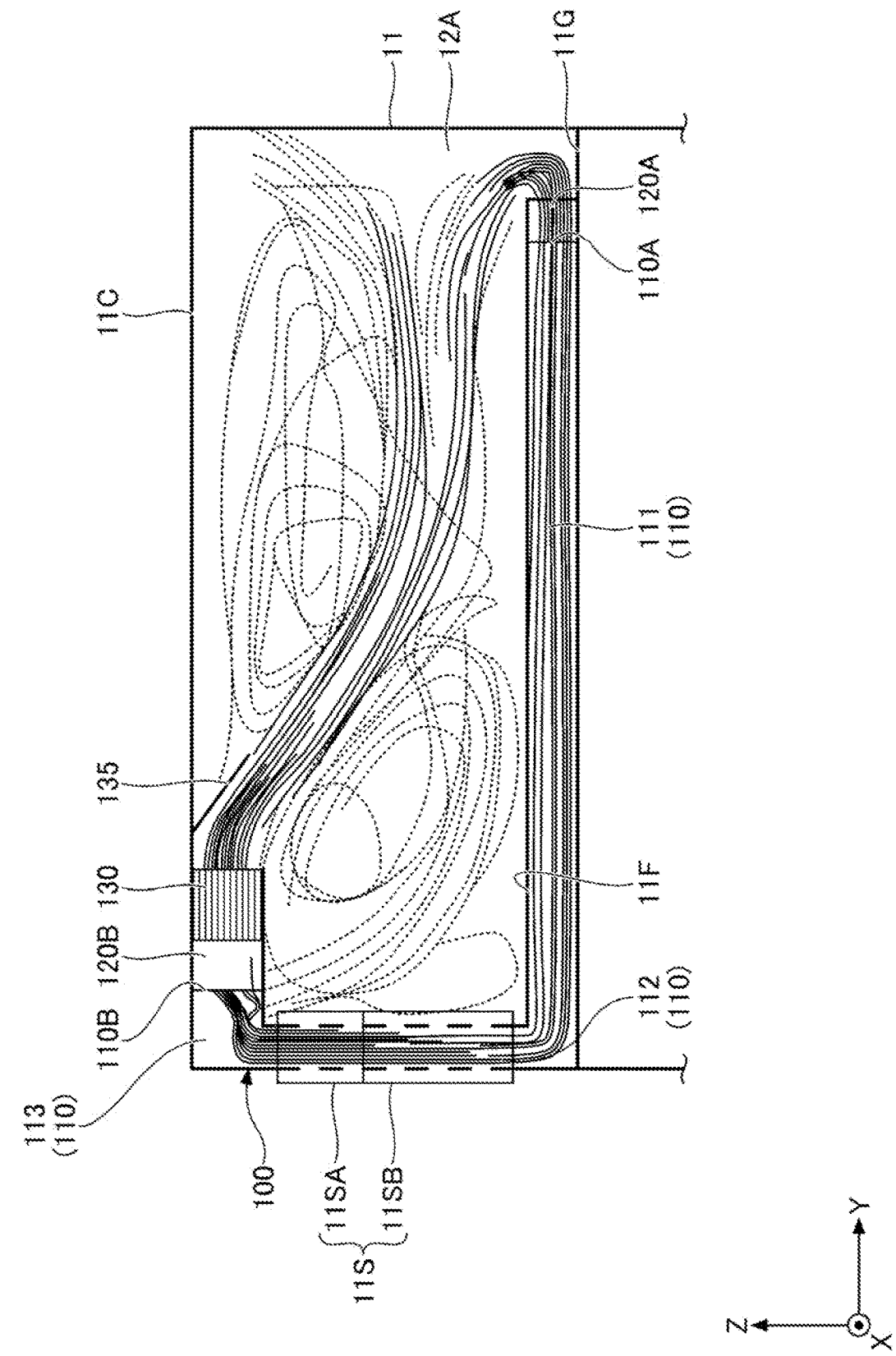
FIG. 9 is a drawing illustrating an example of airflow obtained by using simulation in the simulation model of the testing apparatus.

FIG. 8 and FIG. 9 are drawings illustrating an example of airflow obtained by a simulation in a simulation model of the testing apparatus 10. FIG. 8, as in FIG. 6, illustrates airflow obtained by viewing downward from the ceiling 11C of the test chamber 11A. FIG. 9, as in FIG. 7, illustrates airflow obtained by viewing the cross-section parallel to the YZ plane of the cell from the +X direction side.

FIG. 8 and FIG. 9 illustrates distributions of airflow having two flow rates occurring within the test chamber 11A when air is exhausted from the filter 130 at a predetermined flow rate. For the two flow rates, airflow having a high flow rate is illustrated by the solid line, and airflow having a low flow rate is illustrated by the dotted line.

As can be seen from FIG. 8 and FIG. 9, the air blown from the filter 130 has a high flow rate, as illustrated by the solid lines, and flows along the Y direction in each of the cells C1 to C4. The air is auctioned by the fan 120A and flows into the filter 130 from the fan 120B through the duct 110 to circulate. Although there is no partition or the like between the cells C1 and C4, it has been found that the four gas circulating devices 100 respectively provided in the cells C1 and C4 form a highly independent airflow in each of the cells C1 and C4. Additionally, it has been found that a portion of air having a low flow rate flows in the X direction across the cells C1 to C4. It is believed that the flow in the X direction has been caused by air turbulence or the like.

FIG. 10 is a drawing illustrating an example of a relationship between the duty cycle of the PWM signal driving the fan 120B and a temperature differential of the chuck 15B. FIG. 10 illustrates results obtained by experiments. For example, the temperature differential of the chuck 15B is shown in a case where the duty cycle of the PWM signal driving the fan 120A is fixed to 100% and the duty cycle of the PWM signal driving the fan 120B is 40%, 60%, 80%, and 100%. The temperature differential of the chuck 15B is indicated by normalized values (i.e., with no unit).

The case where the duty cycle of the PWM signal driving the fan 120B is 40%, 60%, 30%, and 100% is a case where the electronic device of the wafer W held in the chuck 15B is actually operated to increase the temperature of the chuck 15B, and the PWM generator 150B sets the duty cycle of the PWM signal driving the fan 120B to 40%, 60%, 80%, and 100%.

Also, because the chuck 15B is cooled by blowing air from the −Y direction side and from the lower side, a temperature differential of the chuck 15B is generated. The temperature differential of the chuck 15B is a difference between the maximum temperature and the minimum temperature in temperatures measured at multiple points of the chuck 15B.

For comparison, the temperature differential of the chuck 15B is shown when the duty cycles of the PWM signals that drive the fans 120A and 120B are both 0%. A duty cycle of 0 indicates that the fans 120A and 120B are not driven.

In FIG. 10, when the duty cycle of the PWM signal driving the fan 120B is relatively small, such as 40% or 60%, the heating value of the wafer W is small. Thus, it can be found that the temperature differential is smaller when the duty cycle is relatively small than when the duty cycle is relatively large, such as 80% or 100%.

Additionally, the temperature differential of the chuck 15B is within the range of 2.17 to 2.5 for any value of the duty cycle of the PWM signal driving the fan 120B of 40%, 60%, 80%, and 100%. Since the temperature of the chuck 15B is lower on the −Y direction side where air is blown than on the +Y direction side, the PWM generator 150B may set the duty cycle in consideration of the temperature differential.

As described above, using the gas circulating device 100, air circulates clockwise in each of the cells C1 to C4 when the YZ cross-section is viewed from the direction side to the −X direction side. Within the test space 12A of the test chamber 11A, in each of the cells C1 to C4, air flows from the filter 130 located upstream toward the fan 120A located downstream. That is, in each of the cells C1 to C4, air flows obliquely downward from the filter 130 toward the fan 120A in the +Y direction and the −Z direction.

The gas circulating device 100 is provided in each of the cells C1 to C4 on each floor, and air that cools one of the chucks 15B is not blown toward the other chucks 15B. To the chuck 15B on each of the cells C1 to C4, clean air is blown from each of the gas circulating devices 100 of the cells C1 to C4, and clean air obtained by the gas circulating device 100 of each of the cells C1 to C4 removing contaminants, such as dust, in the air separately (or independently) circulates in each of the cells C1 to C4.

Thus, the chuck 15B of each of the cells C1 to C4 on each floor can be uniformly cooled.

Therefore, the testing apparatus 10 that can uniformly cool multiple chucks 15B that are respectively provided corresponding to multiple testers 15 can be provided.

In particular, if the number of testers 15 is equal to the number of chucks 15B, the chucks 15B can be uniformly coded in all cells in the testing apparatus 10.

Here, because air is blown toward the chuck 15B from the −Y direction side, there may be a tendency to cool the chuck 15B more on the −Y direction side. In such a case, a heater of the chuck 15B may be used to increase the heating amount of the chuck 15B on the −Y direction side to reduce the temperature differential throughout the chuck 15B. In this case, the heater of the chuck 15B may be configured so that as the flow rate of the air exhausted from the filter 130 increases, a temperature differential (i.e., a temperature difference caused by heating of the heater) between the chuck 15B on the −Y direction side and the chuck 153 on the +Y direction side when the heater of the chuck 15B heats the chuck 15B increases.

The gas circulating device 100 includes the duct 110, the fans 120A and 120B, the filter 130, and the controller 150, as illustrated in FIGS. 1 to 7. The duct 110, the fans 120A and 120B, the filter 130, and the controller 150 are all provided within the housing 11 and the planar size of the housing 11 itself does not change to provide the gas circulating device 100. Therefore, the footprint (i.e., an installation area) of the testing apparatus 10 can be reduced.

Additionally, since the gas circulating device 100 is used as a mechanism for circulating air to cool the chuck 15B, the testing apparatus 10 that can cool the chuck 15B while cleaning the air in the test chamber 11A can be provided.

Because the testing apparatus 10 has a configuration that does not include a cooling mechanism for cooling the chuck 15B by using a cooling liquid (i.e., a chiller unit), a thinner chuck 15B can be used. Further, the chiller unit requires a flow path for allowing a cooling liquid to flow to the chuck 15B, a generating device that generates a cooling liquid, or a container, but the gas circulating device 100 does not require a flow path of a cooling liquid, a generating device for generating a cooling liquid, or a container, and the gas circulating device 100 can be achieved at a relatively low cost. Thus, the testing apparatus 10 with a low manufacturing cost can be provided.

Because the gas circulating device 100 has a simpler configuration than the chiller unit described above, maintenance costs can be reduced. Thus, the testing apparatus 10 with a low running cost can be provided. Additionally, because the gas circulating device 100 does not use a cooling liquid, there is no possibility of liquid leakage, so that running costs can be suppressed from such a viewpoint.

Although the configuration in which the gas circulating device 100 circulates air inside the test chamber 11A has been described, the chuck 15B may be cooled by circulating a gas, such as dry air, instead of air.

Although the configuration in which the gas circulating device 100 may be provided in each of the cells C1 to C4 on each floor has been described, the gas circulating device 100 may not be provided in at least one cell. In this case, for example, in a cell without the gas circulating device 100, a gas circulating device that is a different type from the gas circulating device 100 may be provided. Alternatively, the gas circulating device 100 in at least one cell may be configured to circulate dry air or the like.

Although the testing apparatus 10 having multi levels in which the cells C1 to C4 stacked for three floors has been described, the cells C1 to C4 may be for one floor, may be stacked for two floors, or may be stacked for more than four floors. The number of cells on each floor may be two or more.

Although a configuration in which the chuck 15B is held by vacuum suction at the pogo frame 15A has been described, a configuration in which the chuck 15B is pressed against the pogo frame 15A may be used. For example, the aligner 19 may press the chuck 15B against the pogo frame 15A.

Although a configuration in which the fans 120A and 120B are driven by the PWM signals has been described, a control signal other than the PWM signal may be used. In accordance with the temperature of the chuck 15B detected by the temperature detecting unit 15C, the fans 120A and 120B may be driven to control the temperature of the chuck 15B to an optimum temperature range.

Although a configuration in which the fan 120A is provided at the suction inlet 110A of the duct 110 has been described, because the fan 120A is an assist fan that assists the fan 120B, if the gas circulating device 100 can sufficiently circulate air in the cell without the fan 120A, the gas circulating device 100 does not need to include the fan 120A.

Although a configuration in which the fan 120B is positioned above the chuck 15B has beer, described, the position of the fan 120B can be appropriately changed depending on the amount of space available in the test chamber 11A. If the fan 120B is positioned at the same height as the chuck 15B, air may be guided to be blown toward the lower surface of the chuck 15B by using a louver or the like to prevent air from being blown only to the side surface of the chuck 15B. If the fan 120B is positioned below the chuck 15B, air may be guided to be blown toward the side surface of the chuck 15B using a louver or the like to prevent air from being blown only to the lower surface of the chuck 15B.

Although the configuration in which the fan 120A is provided on the floor 11F has been described, the position of the fan 120A can be appropriately changed depending on the amount of space available in the test chamber 11A. The fan 120A may be positioned at the same height as the fan 120B, but is preferably below the fan 120B. This is because air can efficiently circulate within the test chamber 11A if the fan 120A is positioned below the fan 120B, because air exhausted from the fan 120B through the filter 130 falls as the air flows in the Y direction.

Although the configuration in which the gas circulating device 100 includes the filter 130 has been described, the gas circulating device 100 does not need to include the filter 130, if the air does not need to be cleaned, for example.

Figure 11:
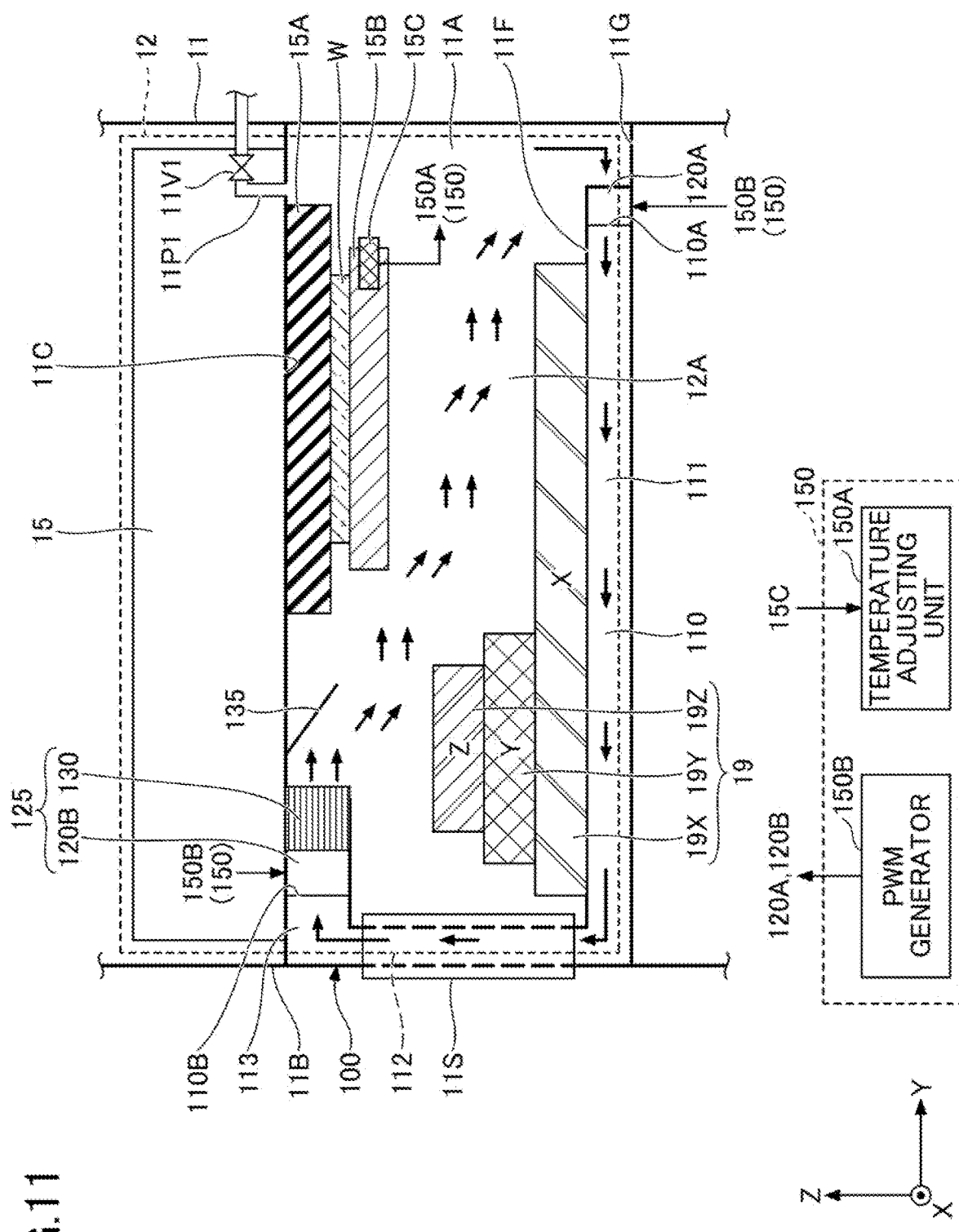
FIG. 11 is a drawing illustrating an example of a configuration of a testing apparatus, which is a modified example of the embodiment.
Figure 12:
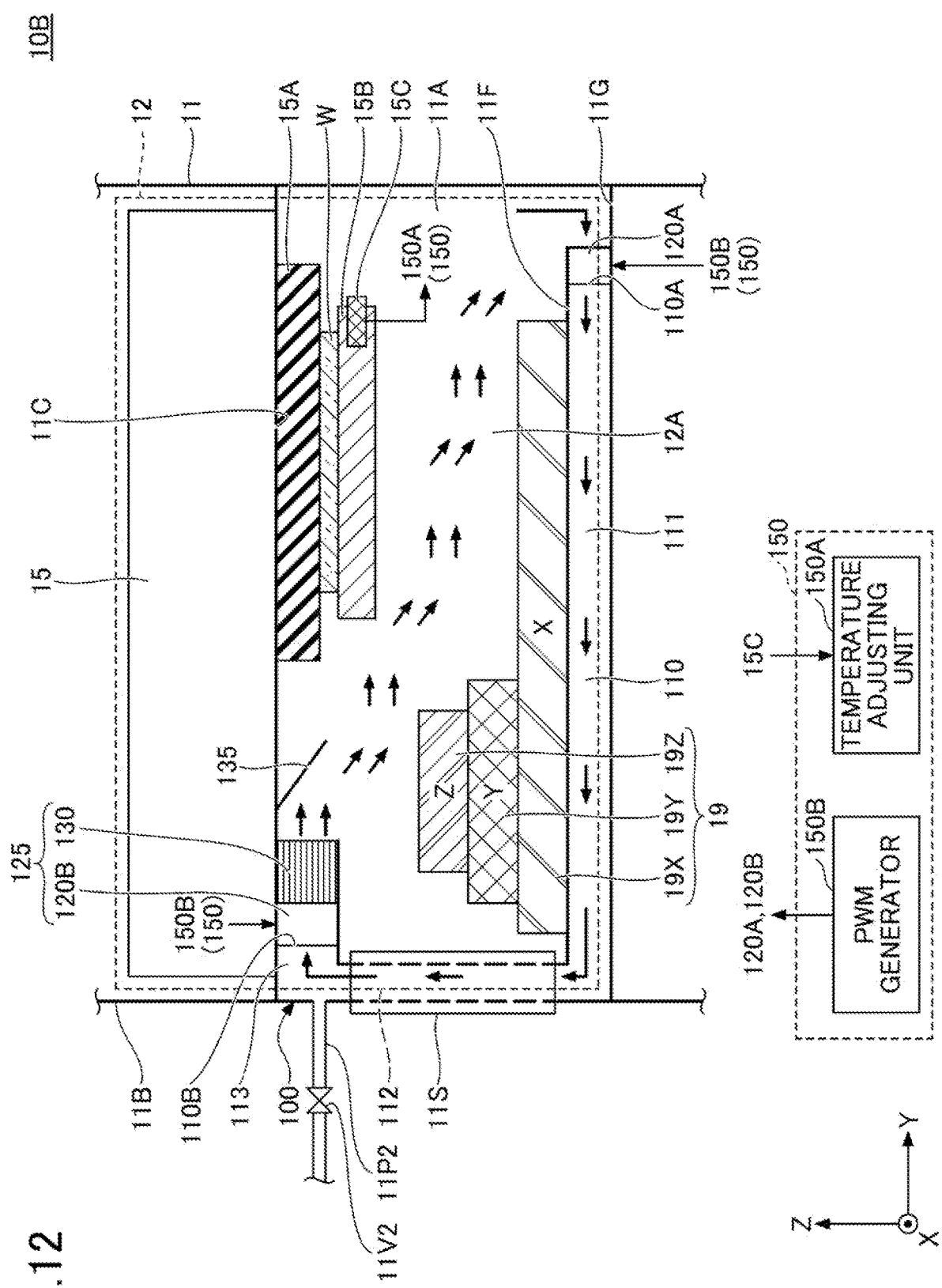
FIG. 12 is a drawing illustrating an example of a configuration of a testing apparatus, which is a modified example of the embodiment.

Configurations illustrated in FIG. 11 and FIG. 12 may be used.

FIG. 11 is a drawing illustrating an example of a configuration of a testing apparatus 10A according to a modified example of the embodiment. FIG. 11 illustrates a cross-sectional configuration corresponding to FIG. 3.

The testing apparatus 10A is a testing apparatus configured to set the temperature of the chuck 15B to a low temperature, and a gas pipe 11P1 is connected to an end of the ceiling 11C of the test chamber 11A on the +Y direction side. The gas pipe 11P1 is provided with a gate valve 11V1.

The gas pipe 11P1 is provided to introduce dry air into the test chamber 11A and is connected to a cylinder or the like that accommodates dry air. If the gate valve 11V1 is opened to circulate dry air by using the gas circulating device 100 in a state in which the test chamber 11A is filled with dry air, the occurrence of condensation on the wafer W or the chuck 15B can be prevented, for example, when the temperature of the chuck 15B is set below zero (e.g., −10° C. to −50° C.).

FIG. 12 is a drawing illustrating an example of a configuration of a testing apparatus 10B according to a modified example of the embodiment. FIG. 11 illustrates a cross-sectional configuration corresponding to FIG. 3.

The testing apparatus 10B is a testing apparatus configured to set the temperature of the chuck 15B to a high temperature, and a gas pipe 11P2 is connected to the flow path 112 of the duct 110. The gas pipe 11P2 is provided with a gate valve 11V2. Here, for example, the temperature of the chuck 15B is set to a high temperature of 70° C. to 100° C.

The gas pipe 11P2 is provided to introduce air into the test chamber 11A and is connected to the outside of the testing apparatus 10B. By opening the gate valve 11V2, air can be suctioned by the fan 120B and introduced into the test chamber 11A through the filter 130, thereby increasing the flow rate of air exhausted from the filter 130.

As described, if the temperature of the chuck 15B is set to a high temperature, the introduction of air effectively increases the flow rate of air blown toward the chuck 15B because there is no possibility of condensation when air is introduced into the test chamber 11A.

An embodiment of the testing apparatus according to the present disclosure has been described above, but the present disclosure is not limited to the above-described embodiment. Various changes, modifications, substitutions, additions, deletions, and combinations can be made within the scope of the recited claims. They are, of course, within the technical scope of the present disclosure.

What is claimed is:

1. A testing apparatus comprising:
    a plurality of testing units arrayed in a first axial direction in plan view, the plurality of testing units being configured to respectively press probes against electronic devices on chucks to test the electronic devices;
    a plurality of gas circulating units respectively disposed in areas each corresponding to one or more testing units among the plurality of testing units, the plurality of gas circulating units respectively including first fans and second fans configured to circulate a gas in the areas along a second axial direction in plan view;
    a plurality of temperature detecting units configured to respectively detect temperatures of the chucks; and
    a controller configured to control drive of the first fans of the plurality of gas circulating units based on the detected temperatures of the chucks,
    wherein each of the plurality of gas circulating units includes a duct including a suction inlet and an exhaust outlet, the suction inlet being provided in a corresponding area of the areas on a first end side of the corresponding area in the second axial direction in plan view and being provided below a chuck in the corresponding area among the chucks, and the exhaust outlet being provided in the corresponding area on a second end side of the corresponding area in the second axial direction in plan view and being provided above the chuck in the corresponding area, and
    wherein each of the first fans is provided at the exhaust outlet of the duct and each second fan being provided at the suction inlet of the duct, such that the gas flows from the exhaust outlet to the suction inlet and along a side surface and a bottom surface of the chuck in the corresponding area.

2. The testing apparatus as claimed in claim 1, wherein the areas respectively correspond to the plurality of testing units, and a number of the plurality of testing units is equal to a number of the plurality of gas circulating units.

3. The testing apparatus as claimed in claim 1, wherein the controller controls drive of each of the first fans so as to increase a rotational speed thereof in a case where a corresponding temperature value exceeds a temperature threshold, the corresponding temperature value being determined based on the temperatures of the chucks detected by the temperature detecting units.

4. The testing apparatus as claimed in claim 1, wherein each of the plurality of gas circulating units further includes a filter that cleans the gas.

5. The testing apparatus as claimed in claim 4, wherein the filter is provided on an exhaust side of each of the first fans.

6. The testing apparatus as claimed in claim 1, wherein airflow of the first fans is directed to the chucks.

7. The testing apparatus as claimed in claim 1, wherein the exhaust outlet of the duct and each of the first fans are provided above the suction inlet of the duct and a corresponding one of the second fans.

8. The testing apparatus as claimed in claim 1, wherein the suction inlet and each of the second fans are provided on a floor in the corresponding area.

9. The testing apparatus as claimed in claim 1,
    wherein the controller uses a pulse width modulation signal to control drive of each of the first fans and uses a pulse width modulation signal to control drive of a corresponding one of the second fans, and
    wherein a duty cycle of the pulse width modulation signal used to control the drive of each of the first fans is greater than a duty cycle of the pulse width modulation signal used to control the drive of the corresponding one of the second fans.

10. The testing apparatus as claimed in claim 1, wherein the plurality of gas circulating units cause the gas to circulate in the areas to cool the chucks and no cooling mechanism that cools the chucks by using a cooling liquid is provided.

* * * * *